(12) United States Patent
Fujiwara et al.

(10) Patent No.: US 6,560,077 B2
(45) Date of Patent: May 6, 2003

(54) CPP SPIN-VALVE DEVICE

(75) Inventors: Hideo Fujiwara, Tuscaloosa, AL (US); Gary J. Mankey, Tuscaloosa, AL (US)

(73) Assignee: The University of Alabama, Tuscaloosa, AL (US)

( * ) Notice: Subject to any disclaimer, the term of this patent is extended or adjusted under 35 U.S.C. 154(b) by 0 days.

(21) Appl. No.: 09/480,132

(22) Filed: Jan. 10, 2000

(65) Prior Publication Data

US 2002/0054461 A1 May 9, 2002

(51) Int. Cl.⁷ .................................................. G11B 5/39
(52) U.S. Cl. .................................................. 360/324.1
(58) Field of Search .............................. 360/324, 324.1, 360/324.11, 324.12, 324.2, 325, 326, 327, 327.1, 327.11, 327.21, 327.2, 327.22, 327.23, 327.24, 327.3, 327.31, 327.32, 327.33

(56) References Cited

U.S. PATENT DOCUMENTS

| | | | | |
|---|---|---|---|---|
| 5,159,513 A | | 10/1992 | Dieny et al. ............... 360/324 |
| 5,290,629 A | * | 3/1994 | Kobayashi et al. ......... 428/332 |
| 5,715,121 A | * | 2/1998 | Sakakima ................. 360/324.2 |
| 5,764,567 A | * | 6/1998 | Parkin ...................... 365/173 |
| 5,879,783 A | * | 3/1999 | Chang et al. ............... 428/141 |
| 5,898,548 A | * | 4/1999 | Dill et al. .................. 360/324.2 |
| 5,936,402 A | * | 8/1999 | Schep et al. ................. 324/252 |
| 6,072,382 A | * | 1/2000 | Daughton et al. ......... 338/32 R |
| 6,080,476 A | * | 1/2000 | Kanbe et al. ............... 428/332 |
| 6,052,263 A | * | 4/2000 | Gill ......................... 360/324.11 |
| 6,077,618 A | * | 6/2000 | Sakakima et al. .......... 428/693 |
| 6,219,212 B1 | * | 4/2001 | Gill et al. ................. 360/324.2 |

FOREIGN PATENT DOCUMENTS

| EP | 0 585 009 A2 | 3/1994 |
|---|---|---|
| EP | 0 628 835 A2 | 12/1994 |
| JP | 06325934 A | 11/1994 |

OTHER PUBLICATIONS

Safanov, et al, "Magnetization reversal as a nonlinear multimode process", Journal of Applied Physics, vol. 85, No. 8, p. 5072–5074.*

M. A. M. GIJS, et al., Physical Review Letters, vol. 70, No. 21, pps. 3343–3346, "Perpendicular Giant Magnetoresistance of Microstructured Fe/Cr Magnetic Multilayers from 4.2 to 300 K", May 24, 1993.

S.–F. Lee, et al., Journal of Magnetism and Magnetic Materials, vol. 118, pps. L1–L5, "Two–Channel Analysis of CPP–MR Data for Ag/Co and AgSn/Co Multilayers", 1993.

(List continued on next page.)

Primary Examiner—Jefferson Evans
(74) Attorney, Agent, or Firm—Oblon, Spivak, McClelland, Maier & Neustadt, PC

(57) ABSTRACT

A spin-valve device of a CPP structure which has a high resistance, and which generates a high output signal with low current. The CPP spin-valve device including a spin-valve element having a substrate and a layered structure formed on the substrate. The layered structure includes a first thin film layer of ferromagnetic material, a second thin film layer of ferromagnetic material, and a thin non-magnetic layer structure separating the first and second layers. One of the first and second thin film layers is defined as a free layer and the other layer is defined as a pinned layer, where the free layer has a direction of magnetization that is easier to change than a direction of magnetization of the pinned layer by application of a magnetic field. The nonmagnetic layer structure includes a conducting part and insulating part, with the conduction part having an area that is smaller than an area of the free layer. The device further includes a device for producing a current flow through the spin-valve element and a field sensor configured to sense variations in resistance of the spin-valve element due to a difference in rotation of the magnetizations in the free layer and the pinned layer caused by an applied magnetic field.

33 Claims, 4 Drawing Sheets

OTHER PUBLICATIONS

B. A. Everitt, et al., IEEE Transaction on Magnetics, vol. 34, pps. 1060–1062, "Pseudo Spin Valve MRAM Cells with Sub–Micrometer Critical Dimension", 1998.

J.–G. Zhu, et al., IEEE Transaction on Magnetics, vol. 34, No. 4, pps. 1063–1065, "Characteristics of AP Bias in Spin Valve Memory Elements", Jul., 1998.

S. L. Burkett, et al. Annealing of Spin Valves with High Exchange Pinning Fields IEEE Transactions on Magnetics, vol. 33, No. 5, Sep. 1997, pp. 3544–3546.

A. B. Kos, et al. High Current Density Measurements of Giant Magnetoresistive Spin–Valves for Magnetic Recording and Sensor Applications IEEE Transactions on Magnetics, vol. 33, No. 5, Sep. 1997, pp. 3541–3543.

Jaquelin K. Spong, et al. Giant Magnetoresistive Spin Valve Bridge Sensor IEEE Transactions on Magnetics, vol. 32, No. 2, Mar. 1996, pp. 366–371.

R. C. O'Handley, et al. New Spin–Valve Magnetic Field Sensors Combined with Strain Sensing and Strain Compensation IEEE Transactions on Magnetics, vol. 31, No. 4, Jul. 1995, pp. 2450–2454.

Y. Kitade, et al. Giant Magnetoresistance Effect in CoNiFe/Cu Spin Valves IEEE Transactions on Magnetics, vol. 31, No. 6, Nov. 1995, pp. 2600–2602.

S. F. Cheng, et al. Magnetostrictive effects in Cu/Co/Cu/Fe spin valve structures Journal of Magnetism and Magnetic Materials 148 (1995), pp. 344–345.

J. M. Daughton, et al. Giant Magnetoresistance in Narrow Stripes IEEE Transaction on Magnetics, vol. 28, No. 5, Sep., pp. 2488–2493.

Robert L. White Giant Magnetoresistance: A Primer IEEE Transactions on Magnetics, vol. 28, No. 5, Sep. 1992.

* cited by examiner

CPP SPIN-VALVE DEVICE

BACKGROUND OF THE INVENTION

1. Field of the Invention

This invention relates, in general, to the field of magnetoresistive spin-valve (SV) devices. More particularly, the present invention relates to a current perpendicular-to-the-plane (CPP) spin-valve device configuration, applicable as a magnetic non-volatile mass-memory called "MRAM," and/or as a magnetic transducer or "head" for reading information signals recorded on a magnetic medium.

2. Description of the Related Arts

The related art discloses a magnetic transducer referred to as a spin-valve (SV) magnetoresistive sensor, e.g., in U.S. Pat. No. 5,159,513, issued on Oct. 27, 1992. An SV element includes at least two ferromagnetic layers with different magnetic field sensitivity, the one of the higher sensitivity being called a "free layer" and the other a "pinned layer." The resistance depends on the angle between the magnetizations of the two layers as cosine of the angle and is independent of the current direction with respect to the magnetization directions, which is traditionally called the giant magnetoresistive effect (GMR). In MRAM's, the information of "0" and "1" is stored either by the direction of the magnetization in the free layer or in the pinned layer. The stored information is read out by applying a field and sensing the sign of the change of the resistance of the SV element. See, for instance, "Characteristics of AP Bias in Spin Valve Memory Elements," J. Zhu and Y. Zheng, IEEE Trans. Magn. Vol. 34, 1063–1065 (1998); "Pseudo Spin Valve MRAM Cells with Sub-Micrometer Critical Dimension," B. A. Everitt et al, IEEE Trans. Magn. Vol. 34, 1060–1062 (1998). An SV element can also be applied to a magnetic field sensor, detecting a magnetic field through the resistance changes of the element. It has been shown that an SV head is capable of reading data from a magnetic surface at great linear densities.

The GMR effect is larger when measured with a current perpendicular to the layer structure than when measured with a current in plane direction. See, for example, "Perpendicular Giant Magnetoresistance of Microstructured Fe/Cr Magnetic multilayers from 4.2 to 300 K," M. A, M. Gijs, S. K. J. Lenczovski and J. B. Giesbers, Physical Review Letters, Vol. 70, 3343–3346 (1993). The former is called CPP (current perpendicular-to-the-plane) and the latter, CIP (current-in-plane). Therefore, it is desirable to make use of CPP rather than CIP if the circumstances allow. However, the drawback in the CPP structure is the fact that only a very low resistance change is obtainable compared to the CIP structure making it necessary to apply a very large current to obtain a reasonable output signal level.

Commercial value arises from an improved CPP (current perpendicular-to-the-plane) spin-valve element that enhances the performance of MRAM's and magnetic read heads, especially in its high output characteristics with a low current.

SUMMARY OF THE INVENTION

An objective of the present invention is to provide a spin-valve (SV) device of a CPP structure which has a high resistance, and which generates a high output signal with a low current.

The invention further advantageously provides an easy method for enabling the CPP spin-valves to be put into practical use, by having a potential of almost double the signal to noise ratio of the CIP (current-in-plane) spin-valve of other devices.

In accordance with the present invention, an SV device having a layered structure called an "SV element" formed on a substrate includes first and second thin film layers of ferromagnetic materials separated by a thin layer structure of non-magnetic material. In the present invention the magnetization of one of the layers of a ferromagnetic material, called a "free layer," is easier to change its direction than that of the other of the layers of a ferromagnetic material, called a "pinned layer," by application of a magnetic field and means to produce a current flow between the free and pinned layers through a conducting part of the non-magnetic layer structure. The area of the conducting part of the non-magnetic layer structure being smaller than the area of the free layer, thus making the resistance between the free and pinned layers much higher than otherwise. The resistance of the SV element changes as a function of the angle between the magnetizations in the free and pinned layers. For memory applications, the information of "0" and "1" is stored by the direction of the magnetization either in the free layer or in the pinned layer. The stored information is read out by applying a field and sensing the sign of the change of the resistance of the SV element. When applied to a field sensor such as a read head in magnetic recording devices, the resistance change of the SV element is sensed due to the difference in rotation of the magnetizations in the free and pinned layers as a function of the magnetic field being sensed. The present invention provides a way of obtaining substantially higher output by applying a lower current than that obtained by devices in the related art.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4b is a side view of FIG. 4a.

DESCRIPTION OF THE PREFERRED EMBODIMENT

Figure 1:
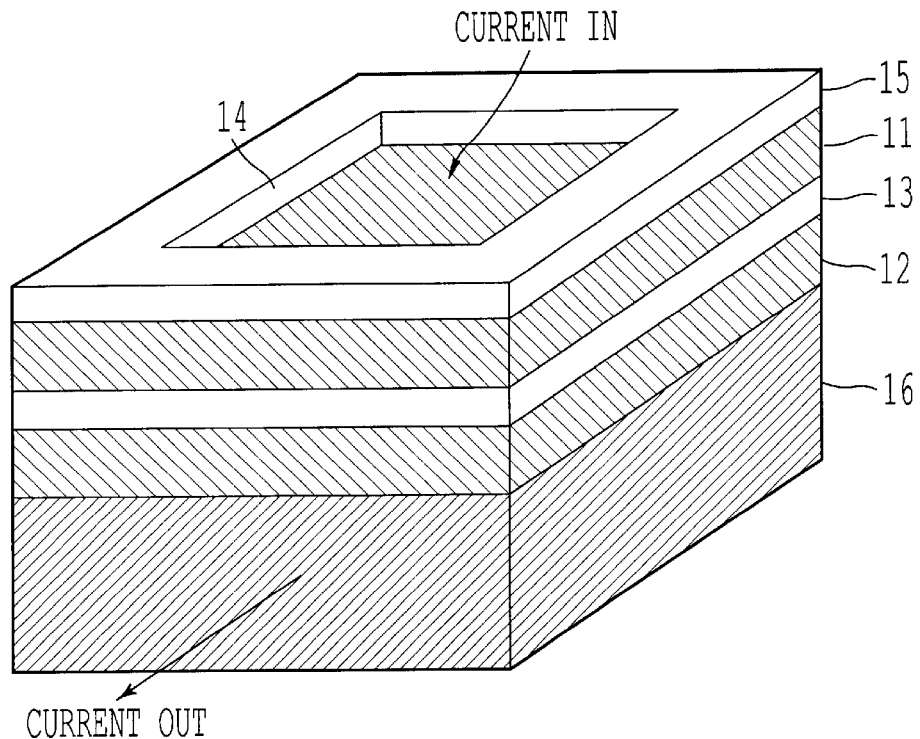
FIG. 1 is a partial isometric view of a first conceptual structure of a CPP-SV device of the related art.

FIG. 1 depicts a conceptual structure of a CPP SV-device of the related art. An SV-element is composed of a free-layer part 11 and a pinned layer part 12 with a conducting layer part 13 in between. The device is also equipped with a device to apply a current from one lead to the other through the contacts provided by the window 14 opened in the insulator layer part 15 coated upon the free layer part 11 and by the conductor 16 underneath the pinned layer part 12. The whole structure is mounted on a substrate (not depicted) which may be either of a magnetic or of a nonmagnetic material with or without a magnetic shield part on top of it and with or without an insulating layer on top. The change of the resistance R, ΔR of the SV element is expressed as a function of the angle θ between the magnetizations of the free and pinned layers is expressed roughly as $$\Delta R = (\Delta \rho / D)(2 - \cos \theta)/2,$$

where Δρ denotes the resistance change for the SV element of a unit area with the change of the angle θ from 0 to 180° by an application of a field and S denotes the area of the SV element. A typical value of Δρ is in the order of $10^{15}$ Ωm$^2$. See, for instance, "Two-channel analysis of CPP-MR data for Ag/Co and AgSn/Co multilayers," S. -F. Lee et al., Journal of Magnetism and Magnetic Materials, Vol. 118, L1–L5 (1993). Assuming that the necessary output voltage is in the order of 10 volts, it turns out that the current density i to be applied to the spin-valve element is to be in the order of $10^{11}$ A/m$^2$. This means that for an SV-element with the area of 1 μm$^2$ the current to be applied comes to be in the order of 100 mA. This is too high a current for ordinary applications, especially for MRAM or high density magnetic recording heads. Desirably the current to be applied is 2 to 3 orders of magnitude lower than these current levels.

Figure 2:
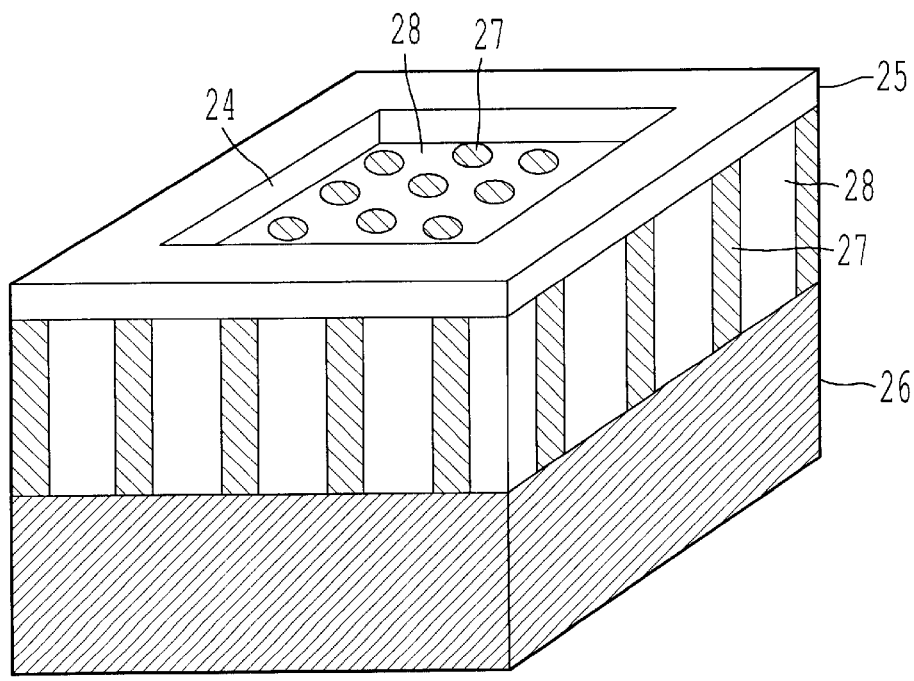
FIG. 2 is a partial isometric view of a second conceptual structure of a CPP-SV device of the related art.

In order to overcome the drawback described above, a CPP-GMR structure has been a proposed as is depicted in FIG. 2. See, for instance, "Perpendicular Giant Magnetoresistance of Microstructured Fe/Cr Magnetic Multilayers from 4.2 to 300 K," M. A. M. Gijs, S. K. J. Lenczovski and J. B. Giesbers, Physical review Letters, Vol. 70, 3343–3346 (1993) and "Perpendicular giant magnetoresistance of multilayered Co/Cu nanowires," K. Liu et al., Physical Review, Vol. 51, 7381–7384 (1995). The parts in FIG. 2 indicated using reference numbers with the same last digit as in FIG. 1 represent the same parts. The GMR-element is made into a narrow pillar structure or nanowires 27 of multilayers of magnetic and nonmagnetic metals embedded in an insulator 28. The number of layers is, typically, greater than 100.

Thus, the object of the present invention is to provide an SV device of a simple structure which allows a substantial reduction in the current to be applied to the CPP-SV element. An exemplary embodiment of the CPP-SV devices, according to the present invention, is depicted schematically in FIG. 3a.

Figure 3A:
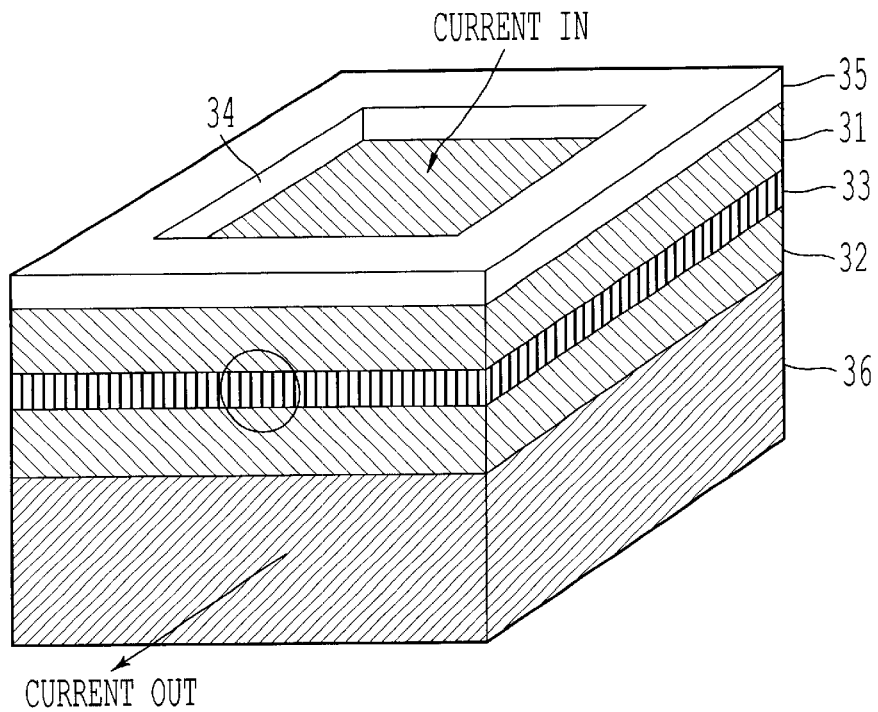
FIG. 3a is a partial isometric view of an embodiment of the present invention.

FIG. 3a depicts a conceptual structure of a CPP SV-device of the present invention. The SV-element is composed of a free-layer part 31 and a pinned layer part 32 with a non-magnetic layer structure 33 in between. The device is also equipped with a device to apply a current from one lead to the other through the contacts provided by the window 34 opened in the insulator layer part 35 coated upon the free layer part 31 and by the conductor 36 underneath the pinned layer part 32. The whole structure is mounted on a substrate (not depicted) which may be either of a magnetic or of a nonmagnetic material with or without a magnetic shield part on top of it and with or without an insulating layer on top.

Figure 3B:
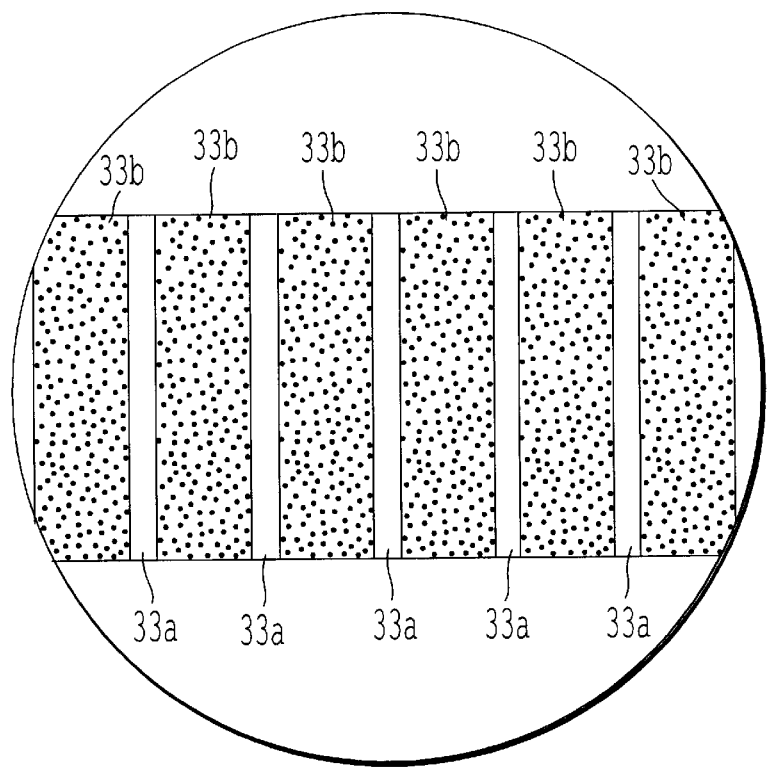
FIG. 3b is a magnification of the part of FIG. 3a enclosed by a circle.

The thin non-magnetic layer structure or conducting layer part 33 includes essentially two parts with significantly different conductivities, typically a conductor part 33a having low resistivity and an insulator part 33b having high resistivity, as depicted schematically in FIG. 3b. This kind of mosaic structure can be made using various methods. One of the preferable methods is a co-deposition of conducting material(s) and insulating material(s) that are essentially immiscible to each other. The conducting materials are preferably selected from the group of Ag, Al, Au, Cr and Cu and their alloys and the insulating materials are preferably selected from the group of the oxides of any elements such as Al, Cr, Cu, Mg, Mn, Nb, Pd, Si, Ta, Ti, V and Zr or the group of nitrides of any elements such as Al, B, C, Si and Ta. This method can be substituted by an alternate method that after making a layered structure of both conducting material (s) and insulating material(s) the layered structure is heat-treated resulting in a mosaic structure. Another is that after a co-deposition of immiscible metals, one of which is easier to oxidize than the other, the deposited layer is exposed to an oxidizing atmosphere. Instead of oxidation, nitrogenation may work if materials with different easiness in nitrogenation are chosen.

The mosaic structure described above can include any inhomogeneous lateral distribution of at least two kinds of parts with a resistivity substantially different from each other, such as a structure with metallic pillars embedded in an insulator medium and a structure with a metal defused into the grain-boundaries of insulator grains. When applied to magnetic recording read heads it is especially beneficial for avoiding the additional magnetic noise if the distance between the adjacent conducting parts is made smaller than the, so called, "exchange length" of the free layer material, which is usually in the range of between several tens of nanometers to several hundred nanometers.

Figure 4A:
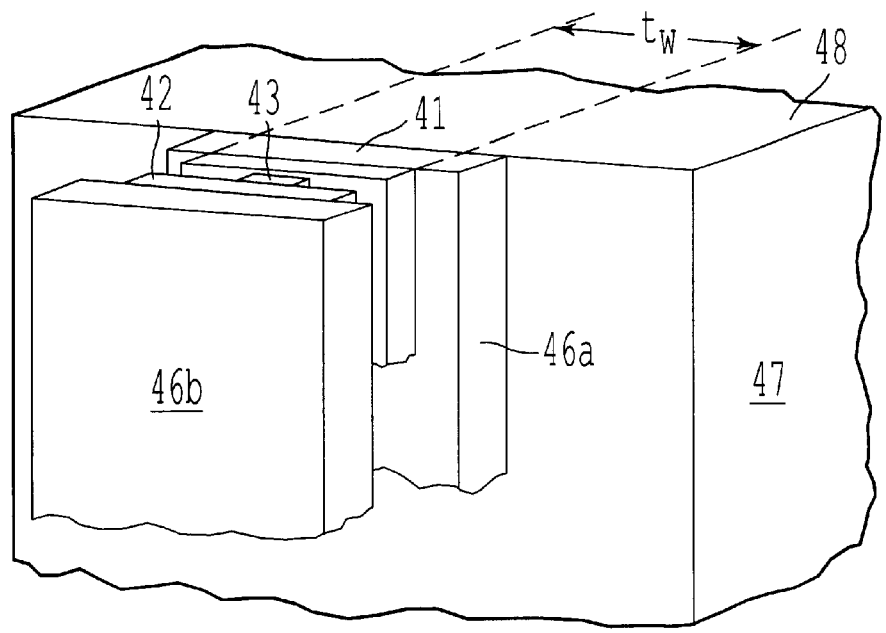
FIG. 4a is a partial isometric view of another embodiment of the present invention.
Figure 4B:
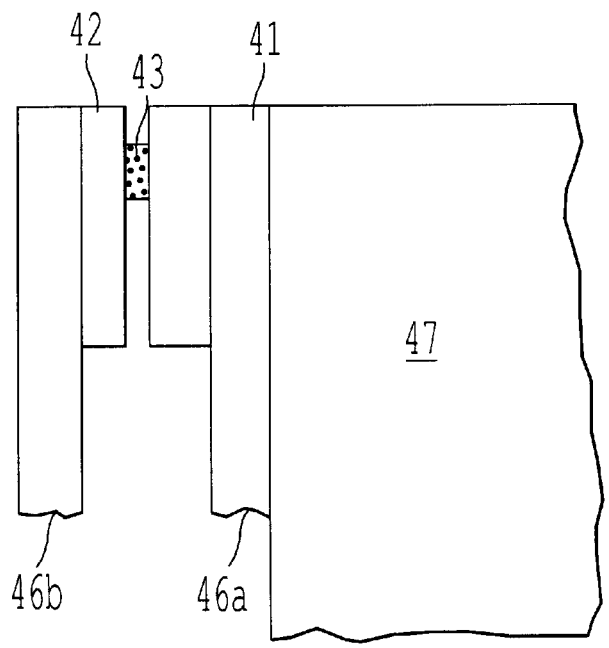

FIGS. 4a and 4b depict another embodiment of the present invention, which is meant to be applied particularly to magnetic recording read heads. Specifically, FIGS. 4a and 4b depict an SV-element that is composed of a free-layer part 41 and a pinned layer part 42 with a non-magnetic layer structure 43 in between. The device is also equipped with a device to apply a current from one lead to the other through the contacts provided by conductors 46a and 46b adjacent member 47.

Figure 5:
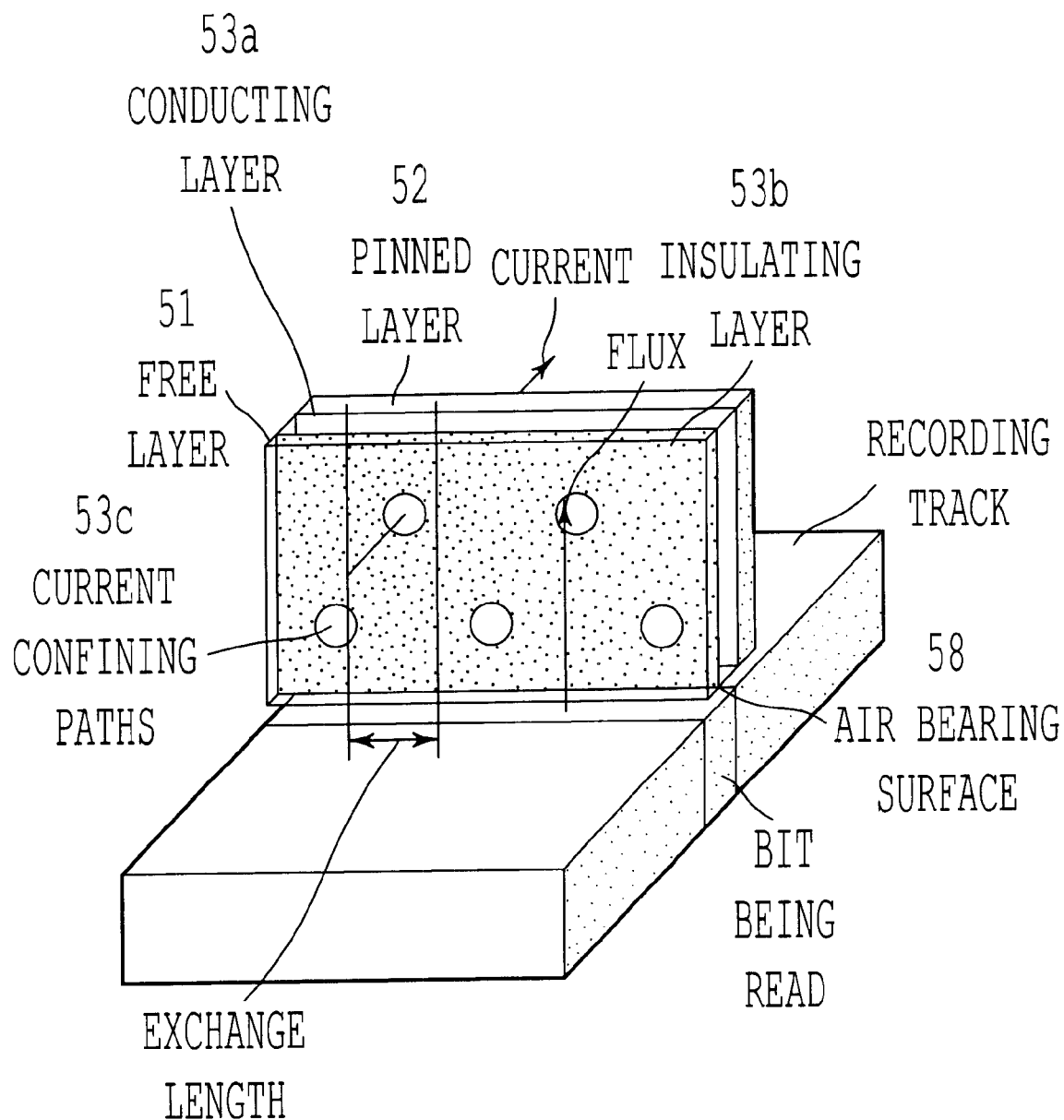
FIG. 5 is a schematic drawing of a third embodiment of the present invention.

FIG. 5 depicts schematically the relationship between the flux direction coming out from the recorded bit in a recording track of a recording medium, the exchange length of the free layer, and the direction of the current passing through the current confining path(s). In the figure, 51 and 52 are the free layer part and the pinned layer part, respectively. 53a, 53b, and 53c are a conducting layer, insulating layer, and current-confining paths formed in the insulating layer, respectively, constructing the non-magnetic layer structure having a plurality of current-confining paths. 58 is the air bearing surface (ABS). The leads connecting the sensor structure to a current source are not shown. The flux coming out of the recorded bit primarily goes through the free layer as is shown by an arrow, and the current goes through the current confining paths substantially perpendicular to the interface between the free layer 51 and the conducting layer 53a, as shown schematically in the figure. The resistance change of the sensor structure, which depends on the density of flux going through the free layer, primarily occurs at the interface. Current is applied along the direction shown by an arrow through electrodes (not shown) on both sides of the multilayer structure of 51, 52, and 53. The current can be either positive or negative. The current is confined into the holes 53c and then diffuses out to some extent as it goes farther from each hole.

In this embodiment, the width of the thin non-magnetic layer structure or conducting layer part 43 is made smaller than the width of the free layer part 41 which determines the track width $t_w$, and its length is also made substantially smaller than that of the free layer part 41. Further, the upper edge of the structure 43 is made retarded from or recessed from the upper surfaces of the other members which form the air bearing surface (ABS) 48 of the read head. This structure gives several advantages. Primarily, because of the narrowed conducting portion the SV-element resistance is high resulting in a high output for a low current as is explained above. Another advantage of this embodiment is that the undesirable effect of the edge on the magnetization distribution in the free-layer is reduced or avoided. At the side edges, some irreversible magnetization process is apt to occur because of the nucleation of reverse domains, which creates substantial noise in the SV outputs. At the lower edge of the free-layer part 41, the magnetization is apt to align rather parallel to the edge, giving rise to a low sensitivity to the signal field. This effect is avoided by making the lower edge of the structure 43 set higher than that of the free-layer part 41, as is depicted in FIGS. 4a and 4b. In this embodiment, the surface of the structure 43 exposed to the media is retarded from or recessed from the ABS 48, thus eliminating the same harmful effect as described for the lower edge portion.

Numerous variations of the present invention are possible in light of the above teachings. It should be understood that the invention is not limited to the specific materials and embodiments described above. It is therefore to be understood that within the scope of the appended claims, the present invention can be practiced other than as specifically described herein.

What is new and desired to be secured by Letters Patent of the United States is:

1. A CPP spin-valve device comprising;
   a spin-valve element including a substrate and a layered structure formed on the substrate, the layered structure having a first thin film layer of ferromagnetic material and a second thin film layer of ferromagnetic material, the first thin film layer and the second thin film layer being separated by a thin non-magnetic layer structure, one of the first and second thin film layers being a free layer and the other of the first and second thin film layers being a pinned layer, the free layer having a direction of magnetization that is easier to change than a direction of magnetization of the pinned layer by application of a magnetic field, the nonmagnetic layer structure including a conducting part and insulating part, the conducting part having an area that is smaller than an area of the free layer;
   means for producing a current flow through the spin-valve element between the free layer and the pinned layer through the conducting part of the non-magnetic layer structure; and
   a field sensor connected to the spin-valve element configured to sense variations in resistance of the spin-valve element due to a difference in rotation of the magnetizations in the free layer and the pinned layer caused by an applied magnetic field;
   wherein the non-magnetic layer structure comprises a mosaic structure of a plurality of conducting parts and a plurality of insulating parts and a distance between adjacent conducting parts is less than an exchange length of the free layer.

2. The CPP spin-valve device of claim 1, wherein:
   the mosaic structure is formed of metal and oxide;
   the metal is selected from the group consisting of Ag, Al, Au, Cr, Cu, Mg, Mn, Pd and their alloys; and
   the oxide is selected from the group consisting of the oxides of Al, Cr, Cu, Mg, Mn, Nb, Pd, Si, Ta, Ti, V and Zr.

3. The CPP spin-valve device of claim 1, wherein the conducting part is formed of metal and the insulating part is formed of oxide.

4. The CPP spin-valve device of claim 3, wherein the metal is selected from the group consisting of Ag, Al, Au, Cr, Cu, Mg, Mn, Pd and their alloys, and the oxide is selected from the group consisting of the oxides of Al, Cr, Cu, Mg, Mn, Nb, Pd, Si, Ta, Ti, V and Zr.

5. The CPP spin-valve device of claim 1, wherein:
   the mosaic structure is formed of metal and nitride;
   the metal is selected from the group consisting of Ag, Al, Au, Cr, Cu, Mg, Mn, Pd and their alloys; and
   the nitride is selected from the group consisting of the nitrides of Al, B, C, Si and Ta.

6. The CPP spin-valve device of claim 1, wherein the conducting part is formed of metal and the insulating part is formed of nitride.

7. The CPP spin-valve device of claim 6, wherein the metal is selected from the group consisting of Ag, Al, Au, Cr, Cu, Mg, Mn, Pd and their alloys, and the nitride is selected from the group consisting of the nitrides of Al, B, C, Si and Ta.

8. The CPP spin-valve device of claim 1, wherein the conducting part is pillar-shaped and is embedded within a medium comprising the insulating part.

9. The CPP spin-valve device of claim 1, wherein the insulating part is comprised of grains having grain boundaries and the conducting part is located along the grain boundaries of the insulating part.

10. The CPP spin-valve device of claim 1, wherein:
    the conducting part has a width that is smaller than a width of the insulating part; and
    the conducting part has a length that is smaller than a length of the free layer.

11. The CPP spin-valve device of claim 1, wherein the conducting part has an upper edge that is recessed from an upper surface of the free layer and an upper surface of the pinned layer which form an air bearing surface of a magnetic recording read head.

12. The CPP spin-valve device of claim 1, wherein the conducting part has a lower surface that is recessed from a lower surface of the free layer.

13. A CPP spin-valve device comprising;
    a spin-valve element comprising a substrate and a layered structure formed on said substrate, the layered structure comprising a first and a second thin film layer of ferromagnetic material separated by a thin non-magnetic layer structure, the magnetization of one of said layers of ferromagnetic material, called a free layer, being easier to change a direction thereof than a direction of the other of said layers of ferromagnetic material, called a pinned layer, by application of a magnetic field and said non-magnetic layer structure including a conducting part;
    means for producing a current flow through said spin-valve element between said free and pinned layers through said conducting part of said non-magnetic layer structure; and
    means for sensing variations in resistance of said spin-valve element due to a difference in rotation of magnetizations in said free and pinned layers caused by an applied magnetic field,
    wherein said non-magnetic layer structure comprises an insulator part and a conductor part, the width of said non-magnetic layer structure within which said conducting part of said non-magnetic layer structure exists is smaller than a width of the free layer which defines the track width of the spin-valve device at least by the exchange length in the free layer.

14. The CPP spin-valve device of claim 13, wherein said non-magnetic layer structure comprises a mosaic structure of conducting, low resistivity and insulating, high resistivity parts.

15. The CPP spin-valve device of claim 14, wherein said mosaic structure comprises metal and oxide.

16. The CPP spin-valve device of claim 15, wherein said metal is selected from the group consisting of Ag, Al, Au, Cr, Cu, Mg, Mn, Pd and their alloys, and said oxide is selected from the group consisting of the oxides of Al, Cr, Cu, Mg, Mn, Nb, Pd, Si, Ta, Ti, V and Zr.

17. The CPP spin-valve device of claim 14, wherein said mosaic structure comprises metal and nitride.

18. The CPP spin-valve device of claim 17, wherein said metal is selected from the group consisting of Ag, Al, Au, Cr, Cu, Mg, Mn, Pd and their alloys, and said nitride is selected from the group consisting of the nitrides of Al, B, C, Si and Ta.

19. A CPP spin-valve device comprising:

a spin-valve element including a substrate and a layered structure formed on the substrate, the layered structure having a first thin film layer of ferromagnetic material and a second thin film layer of ferromagnetic material, the first thin film layer and the second thin film layer being separated by a thin non-magnetic structure, one of the first and second thin film layers being a free layer and the other of the first and second thin film layers being a pinned layer, the free layer having a direction of magnetization that is easier to change than the direction of magnetization of the pinned layer by application of a magnetic field, the nonmagnetic layer structure having at least one current-confining path;

means for producing a current flow through the spin-valve element between the free and the pinned layer through the at least one current-confining path;

means connected to the spin-valve element for sensing variations in resistance of the spin-valve element due to a difference in rotation of the magnetizations in the free layer and the pinned layer caused by an applied magnetic field;

wherein the at least one current-confining path is formed within every flux path of a width of the exchange length of the free layer except at the edge of the free layer.

20. The CPP spin-valve device of claim 19, wherein the non-magnetic layer structure comprises a mosaic structure of a plurality of conducting parts and a plurality of insulating parts.

21. The CPP spin-valve device of claim 20, wherein a distance between adjacent conducting parts is less than the exchange length of the free layer.

22. The CPP spin-valve device of claim 20, wherein:

the mosaic structure is formed of metal and oxide;

the metal is selected from the group consisting of Ag, Al, Au, Cr, Cu, Mg, Mn, Pd and their alloys; and the oxide is selected from the group consisting of the oxides of Al, Cr, Cu, Mg, Mn, Nb, Pd, Si, Ta, Ti, V and Zr.

23. The CPP spin-valve device of claim 19, wherein the conducting part is formed of metal and the insulating part is formed of oxide.

24. The CPP spin-valve device of claim 23, wherein the metal is selected from the group consisting of Ag, Al, Au, Cr, Cu, Mg, Mn, Pd and their alloys; and the oxide is selected from the group consisting of the oxides of Al, Cr, Cu, Mg, Mn, Nb, Pd, Si, Ta, Ti, V and Zr.

25. The CPP spin-valve device of claim 19, wherein:

the mosaic structure is formed of metal and nitride;

the metal is selected from the group consisting of Ag, Al, Au, Cr, Cu, Mg, Mn, Pd and their alloys; and the nitride is selected from the group consisting of the nitrides of Al, B, C, Si and Ta.

26. The CPP spin-valve device of claim 19, wherein the conducting part is formed of metal and the insulating part is formed of nitride.

27. The CPP spin-valve device of claim 26, wherein the metal is selected from the group consisting of Ag, Al, Au, Cr, Cu, Mg, Mn, Pd and their alloys; and the nitride is selected from the group consisting of the nitrides of Al, B, C, Si and Ta.

28. The CPP spin-valve device of claim 19, wherein the conducting part is pillar-shaped and is embedded within a medium comprising the insulating part.

29. The CPP spin-valve device of claim 19, wherein the insulating part is comprised of grains having grain boundaries and the conducting part is located along the grain boundaries of the insulating part.

30. The CPP spin-valve device of claim 19, wherein:

the conducting part has a width that is smaller than a width of the insulating part; and the conducting part has a length that is smaller than a length of the free layer.

31. The CPP spin-valve device of claim 19, wherein the conducting part has an upper edge that is recessed from an upper surface of the free layer and an upper surface of the pinned layer which form an air bearing surface of a magnetic recording read head.

32. The CPP spin-valve device of claim 19, wherein the conducting part has a lower surface that is recessed from a lower surface of the free layer.

33. The CPP spin-valve device of claim 19, wherein the non-magnetic layer structure has a plurality of current confining paths.

* * * * *